(12) United States Patent
Kobayashi et al.

(10) Patent No.: US 7,674,561 B2
(45) Date of Patent: Mar. 9, 2010

(54) MASK BLANKS AND METHOD OF PRODUCING THE SAME

(75) Inventors: Hideo Kobayashi, Tokyo (JP); Takao Higuchi, Tokyo (JP)

(73) Assignee: Hoya Corporation, Tokyo (JP)

( * ) Notice: Subject to any disclaimer, the term of this patent is extended or adjusted under 35 U.S.C. 154(b) by 962 days.

(21) Appl. No.: 10/951,696

(22) Filed: Sep. 29, 2004

(65) Prior Publication Data

US 2005/0069787 A1      Mar. 31, 2005

(30) Foreign Application Priority Data

Sep. 29, 2003    (JP) .............................. 2003-338533

(51) Int. Cl.
*G03F 1/00*      (2006.01)
*B05D 3/12*      (2006.01)

(52) U.S. Cl. .......................................... 430/5; 427/240
(58) Field of Classification Search ..................... 430/5; 427/240
See application file for complete search history.

(56) References Cited

U.S. PATENT DOCUMENTS

| | | | |
|---|---|---|---|
| 4,748,053 A | | 5/1988 | Okada |
| 5,380,609 A | * | 1/1995 | Fujita et al. ..................... 430/5 |
| 5,695,817 A | | 12/1997 | Tateyama et al. |
| 5,762,709 A | | 6/1998 | Sugimoto et al. |
| 6,020,109 A | * | 2/2000 | Okamoto et al. ............. 430/311 |
| 6,162,564 A | | 12/2000 | Heida et al. |
| 6,168,897 B1 | * | 1/2001 | Ushirogouchi et al. ....... 430/139 |
| 7,195,845 B2 | * | 3/2007 | Kobayashi et al. ............. 430/5 |
| 2001/0028920 A1 | * | 10/2001 | Ito et al. ....................... 427/240 |
| 2002/0086220 A1 | | 7/2002 | Nozawa |

FOREIGN PATENT DOCUMENTS

| | | |
|---|---|---|
| JP | 4-29215 B2 | 5/1992 |
| JP | 2001-259502 A | 9/2001 |
| KR | 1985-0005097 A | 8/1985 |
| KR | 1991-0000275 | 1/1991 |
| KR | 19910000275 B1 | 1/1991 |

(Continued)

OTHER PUBLICATIONS

Taiwanese Office Action dated Nov. 19, 2008.

(Continued)

*Primary Examiner*—Mark F Huff
*Assistant Examiner*—Jonathan Jelsma
(74) *Attorney, Agent, or Firm*—Sughrue Mion, PLLC

(57) ABSTRACT

A method of producing a mask blank has a resist film forming (resist coating) process of dispensing a resist solution containing a resist material and a solvent onto a square-like substrate, and rotating the substrate to spread the dispensed resist solution over the substrate and to dry the resist solution on the substrate, thereby forming a resist film on the substrate. While the substrate is rotated in the resist film forming (resist coating) process, an exhausting member performs an exhausting operation to cause an airflow along an upper surface of the substrate from the center of the substrate towards an outer peripheral portion of the substrate so that a puddle of the resist solution formed at a peripheral end portion of the substrate is prevented from being moved towards the center of the substrate by the rotation of the substrate.

19 Claims, 3 Drawing Sheets

FOREIGN PATENT DOCUMENTS

| | | |
|---|---|---|
| KR | 1997-0051938 A | 7/1997 |
| KR | 1997-0072021 A | 11/1997 |
| KR | 1998024717 A | 7/1998 |
| KR | 19990045535 A | 6/1999 |
| KR | 100244171 B1 | 3/2000 |
| KR | 100274756 | 12/2000 |
| KR | 100274756 B1 | 12/2000 |
| KR | 2001-0095279 A | 11/2001 |
| KR | 20010098810 A | 11/2001 |
| KR | 20020013796 A | 2/2002 |
| KR | 20020014690 A | 2/2002 |
| KR | 20020055365 A | 7/2002 |
| KR | 2002-40677099 A | 10/2002 |
| WO | 03077570 A1 | 9/2003 |

OTHER PUBLICATIONS

Resist Spin Coat Module Product Name: Crimson-SR Jul. 31, 2002.

C. Krauss et al., "STEAG Hama Tech Resist Coater ASR5000"—tool concept and process results—. pp. 684-693. 22nd Annual BACUS Symposium on Photomask Technology, Brian J. Grenon, Kurt R. Kimmel Editors, Proceedings of SPIE vol. 4889 (2002) © 2002 SPIE 0277-786X/02/ $15.00.

* cited by examiner

MASK BLANKS AND METHOD OF PRODUCING THE SAME

This application claims priority to prior Japanese patent application JP 2003-338533, the disclosure of which is incorporated herein by reference.

BACKGROUND OF THE INVENTION

This invention relates to a method of producing mask-blanks (may be referred to as "blanks" or "mask blank" or "mask blanks" or "photomask blank" or "photomask blanks" or "photomask blanks substrate") including a resist coating process of uniformly applying a resist solution and uniformly forming a resist film on a square-like (a square or a rectangular) substrate. This invention also relates to the blanks having the resist film formed on the square-like substrate.

In order to produce the blanks by forming a resist film on a square-like substrate with or without a single-layer or a multi-layer thin film of various types deposited thereon, use is generally made of a spin-coating method using a resist coating apparatus for coating the substrate with the resist film by applying and dispensing a resist solution onto the substrate and rotating the substrate. For example, Japanese Patent Publication (JP-B) No. H4-29215 (corresp. to U.S. Pat. No. 4,748,053) disclosed a resist spin-coating method capable of forming a uniform resist film which is not thickened at four corners of a square-like substrate.

The spin-coating method disclosed in the above-mentioned publication comprises a uniformly coating step and a drying step. In the uniformly coating step, a resist solution is dispensed onto a substrate, and the substrate is rotated at a preselected rotation speed for a preselected rotation time to form a resist film having a uniform thickness within the substrate including four corners of the substrate. The preselected rotation speed and the preselected rotation time are determined so that a product of the preselected rotation speed and the preselected rotation time is less than 24000 (rpm·sec) with maintaining the preselected rotation time less than 20 seconds. In the drying step, the substrate is rotated at a rotation speed lower than the preselected rotation speed in the uniformly coating step to dry the resist film while keeping the resist film uniformity obtained in the uniformly coating step.

In the above-mentioned publication, description is made of a specific embodiment using a chromium-coated substrate (127 mm×127 mm) and a resist solution which contains a main-chain-fragmentation resist comprising a high-molecular-weight resin and solvent and which typically has a relatively high viscosity, such as poly(butene-1-sulfone) having a viscosity of 30 cp or poly(glycidyl methacrylate) having a viscosity of 15 cp. The resist solution is applied and dispensed onto the substrate, and the substrate is rotated under a rotating condition previously selected within the above-mentioned range. Then, the substrate is subjected to a predetermined heating/drying (drying-by-heating) process. Thus, a resist film is formed. Non-uniformity in thickness of the resist film is suppressed below 90 Å and further to 50 Å in an effective pattern forming region (critical area) of 107 mm×107 mm at the center of the substrate where an effective pattern (main pattern or device pattern) to be transferred to an object will be formed.

In recent years, a reduction projection exposure apparatus of a step-and-repeat system (stepper) was adapted to expose a larger exposure area (field). Further, a reduction projection exposure apparatus of a step-and-scan system (scanner) was developed. As a consequence, a transfer mask or reticle (mask, hereafter) and the blanks as a material thereof are increased in substrate size from 127 mm×127 mm to 152.4 mm×152.4 mm. Following the increase in substrate size, the critical area on the mask and the blanks is also enlarged to 132 mm×132 mm. Furthermore, a long side of the critical area (in parallel to a scanning direction of the scanner) is increased in length to 140 mm.

Moreover, there is a recent demand for improvement in CD (Critical Dimension) uniformity (dimensional accuracy) following miniaturization of a pattern to be transferred to a semiconductor substrate or the like by the use of the mask produced from the blanks.

Following the above-mentioned demand, a requirement for the resist film thickness uniformity within a substrate becomes more and more strict. In the critical area mentioned above, the resist film thickness uniformity within a substrate (i.e., the difference between the maximum thickness and the minimum thickness of the resist film within the critical area) is requested to be 100 Å or less, more preferably 50 Å or less.

In addition to the main pattern in the critical area, the mask is also provided with auxiliary patterns, such as an alignment mark, a barcode, and a quality assurance pattern, formed in an outer peripheral portion surrounding the critical area at the center of the mask or the blanks substrate. Since the critical area is enlarged, these auxiliary patterns are formed in an area closely adjacent to the outer peripheral end (the edge) of a principal surface of the substrate.

Further, following the miniaturization of the pattern, a resist material was also changed. For example as a positive resist, use has generally been made of a main-chain-fragmentation resist comprising a high-molecular-weight resin or a dissolution-inhibited resist comprising a novolak resin and a dissolution inhibitor. However, those resists are recently replaced by a chemically amplified resist comprising, for example, a poly(hydroxystyrene) (PHS) resin and a photo acid generator, and assuring a higher resolution and a higher sensitivity.

Furthermore, a part of the resist film formed at a peripheral end portion of the substrate (edge bead) may be stripped off or flaking during handling of the substrate, and may cause dust (particle defect) which may not only result in a product defect but also may prevent the substrate from being accurately handled or held in subsequent processes and steps. In view of the above, it is requested to remove an unnecessary part of the resist film formed at the peripheral end portion (i.e. edge bead) of the blanks substrate. For the mask production, various resist species are proposed till now. As a concourse, it becomes difficult to suppress thickness non-uniformity of the resist film in the critical area to 100 Å or less, further 50 Å or less by the conventional resist spin-coating method which has been used in the blanks production, as a result of enlargement of the blanks substrate size and the critical area mentioned above.

In particular, the chemically amplified resist, which has recently been drawing attention as a resist material and which comprises, for example, a poly(hydroxystyrene) (PHS) resin and a photo acid generator, is dissolved by a solvent to obtain a resist solution. The solvent generally consists of or contains, as a main component, one of propylene glycol monomethyl ether acetate (PGMEA), propylene glycol monomethyl ether (PGME), methyl isoamyl ketone (MAK), and ethyl lactate (EL). The above-mentioned resist solution has an average molecular weight less than 100,000 and generally has a low viscosity (less than 10 mPa·s) and is easily dryable. When the conventional spin-coating method is carried out, the resist film is at first uniformly formed on a square-like substrate in the uniformly coating step. However, the resist solution accumulated in the outer peripheral portion of the substrate (in particular, at four corners of the substrate) tends to be drawn back towards the center of the substrate during rotation of the substrate in the uniformly coating step, as well in the drying step following the uniformly coating step, and tends to be dried while being drawn back.

Under the above-mentioned situation where the critical area is enlarged (for example, an area of 132 mm×132 mm at the center of the substrate), desirable resist film thickness uniformity of 100 Å or less or 50 Å or less within the critical area, can hardly be obtained.

As described above, the auxiliary patterns are formed in the area closely adjacent to the outer peripheral end (i.e. edge) of the substrate, as a result of enlargement of the critical area. According to the conventional resist spin-coating method, the resist film thickness becomes extremely large or sometimes extremely small in the outer region where the auxiliary patterns are formed. In this event, the auxiliary patterns can not be formed in exact conformity with a designed dimension or a desired fidelity in shape, and a pattern error can be caused.

Moreover, the chemically amplified resist comprising, for example, the poly(hydroxystyrene) resin and the photo acid generator is generally brittle when the resist film is formed by the spin-coating and the subsequent heating and drying (i.e. baking), as compared with a main-chain-fragmentation resist or a crosslinking resist comprising a high-molecular weight resin and having been used so far. The resist film is stripped off or flaking by contact with a storage container, a delivery container, or various other processing apparatuses, causing dust (particle defect), in case when the resist film formed at the peripheral end portion of the substrate (i.e. edge bead) is not removed. This results in an increase in occurrence of defects of the mask or the blanks (product).

SUMMARY OF THE INVENTION

It is therefore an object of this invention to provide a method of producing mask-blanks, which is capable of assuring a desired resist film thickness uniformity within a predetermined critical area for resist film thickness uniformity (corresponding to a critical area on a mask for main patterns) even if the critical area is enlarged.

It is another object of this invention to provide mask-blanks which are capable of suppressing significant deviation in resist film thickness in an auxiliary pattern forming region surrounding a critical area located at the center of a blanks substrate (corresponding to a critical area on a mask for main patterns) even if the critical area is enlarged.

It is still another object of this invention to provide mask-blanks and a method of producing the same, which are capable of preventing occurrence of dust (particle defect) as a result of stripping off and flaking of an extremely thick part of a resist film formed at a peripheral end portion (edge) of a substrate and, even after the resist film at the peripheral end portion (edge) of the substrate is removed, suppressing and preventing occurrence of dust (particle defect) from a removal end.

The present inventors observed a behavior of the resist solution at an outer peripheral portion of the substrate (in particular, at four corners located outside an inscribed circle of the substrate) when the resist spin-coating is carried out. Such behavior of the resist solution is not problematic in the past but becomes important with enlargement of the critical area for the resist film thickness uniformity within a substrate. A number of experimental tests have repeatedly been carried out in order to observe the change in resist solution behavior when applied onto the substrate by varying rotation speed and rotation time on the spin-coating. And, as a result, the following facts have been confirmed.

In the following, a first step (uniformly coating step) is a step of mainly forming a resist film having a uniform thickness by spreading resist solution after dispensing, which composes or constitutes a primary stage with the other subsidiary steps in the resist coating process. The rotation speed and the rotation time of the substrate in the first step (uniformly coating step) are referred to as main rotation speed (a uniformly coating speed) and a main rotation time (a uniformly coating time), respectively. A second step (drying step) is a step of mainly drying the resist film having the uniform thickness, which composes or constitutes a subsequent secondary stage with the other subsidiary steps in the resist coating process. The rotation speed in the second step (drying step) is referred to as a drying rotation speed.

A primary stage includes the first step (the uniformly coating step) of mainly forming the above-mentioned resist film having a uniform thickness, and a secondary stage includes the second step (drying step) of mainly drying the resist film while maintaining the uniform thickness of the resist film.

In the first step (uniformly coating step):

Assuming that the drying rotation speed in the second step (drying step) is low (for example, 50 rpm):

(1) If the main rotation speed is low and the main rotation time is short, a centrifugal force for uniformly spreading the resist solution dispensed from a resist supplying nozzle is insufficient. Therefore, the resist solution dispensed from a resist supplying nozzle is not uniformly spread to the outer peripheral portion of the substrate. In this case, the resist film formed has a convex shape (dome-like shape) with a larger thickness at the center and a smaller thickness at the outer peripheral portion of the substrate.

(2) If the main rotation speed is small but if the main rotation time is long, the resist solution can not uniformly be spread to the outer peripheral portion of the substrate, like in (1). As a whole, the resist film formed has a convex shape (plateau-like shape) with a larger thickness at the center and a smaller thickness at the outer peripheral portion of the substrate. On the other hand, since the main rotation time is long, a puddle of the resist solution is formed at each of the four corners of the substrate. Further, the resist solution partly runs back towards the center of the substrate. In this case, the thickness of the resist film at the four corners of the substrate (within the critical area) is slightly greater than that at the center of the substrate.

(3) If the main rotation speed is high but the main rotation time is short, the resist film as a whole has a slightly convex shape with a larger thickness at the center and a smaller thickness at the outer peripheral portion of the substrate, like in (2). On the other hand, since the main rotation speed is high, a puddle of the resist solution is formed at each of the four corners of the substrate. Further, the resist solution partly runs back towards the center of the substrate. In this case, the thickness of the resist film at the four corners of the substrate (within the critical area) is slightly greater than that at the center of the substrate.

(4) If the main rotation speed is high and the main rotation time is long, a stronger centrifugal force is exerted for a longer time. Therefore, the resist film as a whole is more flat at the center of the substrate, as compared with (3). On the other hand, since the main rotation time is long and the main rotation speed is high, a puddle of the resist solution is dried up at each of the four corners of the substrate without running back towards the center of the substrate. Therefore, the thickness of the resist film at each of the four corners of the substrate (within the critical area) is extremely greater than that at the center of the substrate. As a result, resist film thickness uniformity within a substrate is significantly degraded.

Next, assuming that the drying rotation speed in the second step (drying step) is relatively high (for example, 500 rpm):

(5) If the main rotation speed is low and the main rotation time is short, the resist solution dispensed from a resist supplying nozzle is not uniformly spread to the outer peripheral portion of the substrate. However, by high-speed drying rotation, the resist solution is concentrated (run out) to the outer peripheral portion of the substrate during an initial stage of the drying step. In this case, the resist film within a critical area has a prominent concave shape with a smaller thickness at the center and a larger thickness at the outer peripheral portion of the substrate.

(6) If the main rotation speed is low but the main rotation time is long, the resist film is generally flat as a whole as compared with (5) although a concave portion is slightly left at the center of the substrate. On the other hand, at each of the four corners of the substrate, a puddle of the resist solution is dried up without running back towards the center of the substrate. In this case, the thickness of the resist film at the four corners within the critical area is greater than that at the center of the substrate.

(7) If the main rotation speed is high and the main rotation time is short, the resist film is generally flat as a whole although a concave portion is left at the center of the substrate, like in (6). On the other hand, at each of the four corners of the substrate, a puddle of the resist solution is dried up without running back towards the center of the substrate. In this case, the thickness of the resist film at the four corners within the critical area is slightly greater than that at the center of the substrate.

(8) If the main rotation speed is high and the main rotation time is long, the resist film as a whole is more flat at the center of the substrate as compared with (7). On the other hand, at each of the four corners of the substrate, a puddle of the resist solution is dried up without running back towards the center of the substrate. In this case, the thickness of the resist film at the four corners within the critical area is extremely larger than that at the center of the substrate. As a result, resist film thickness uniformity within a substrate is significantly degraded.

Herein, in the second step (drying step), the drying rotation time is a time required until the solvent contained in the resist solution applied onto the substrate is evaporated and the resist film is dried. In other words, the drying rotation time is a time required until the resist film reaches a state where no substantial variation (reduction) in thickness occurs due to external factors except a thermal factor (i.e. resist baking).

In order to solve the above-mentioned problems, this invention has the following structures by taking into consideration the relationship among the resist film thickness uniformity within the critical area, the rotation speed, and the rotation time for the spin-coating.

Structure 1

A method of producing a mask blank, the method comprising a resist film forming (resist coating) process of dispensing a resist solution containing a resist material and a solvent onto a square-like substrate, rotating the substrate to spread the dispensed resist solution over the substrate, and drying the resist solution spread on the substrate, thereby forming a resist film on the substrate, wherein, while the substrate is rotated in the resist film forming process, an airflow is produced along an upper surface of the substrate from the center of the substrate towards an outer peripheral portion of the substrate, thereby suppressing a puddle of the resist solution formed at an outer peripheral portion of the substrate from moving towards the center following the rotation of the substrate.

In the structure 1, the airflow is produced while the substrate is rotated in the resist film forming process so that the airflow flows along the upper surface of the substrate from the center of the substrate towards the outer peripheral portion of the substrate. As mentioned above, the resist film forming (resist coating) process is composed of the primary stage which includes the first step (uniformly coating step), and the secondary stage which includes the second step (drying step) mentioned above. In the first step (uniformly coating step), a puddle of the resist solution formed at each of four corners of the substrate and the outer peripheral portion of the substrate (i.e., an end portion of a principal surface of the substrate) can effectively be splashed outward from the substrate by generation of the airflow flowing from the center of the substrate towards the outer peripheral portion of the substrate. Further, it is possible to effectively suppress the puddle of the resist solution formed at the four corners of the substrate and the outer peripheral portion of the substrate from being drawn back towards the center of the substrate. Therefore, a thick region of the resist film formed at the four corners and the peripheral end portion of the substrate is reduced, and the thickness of the thick region is reduced (thickening is suppressed). Thus, even if the critical area for the resist film thickness uniformity within a substrate is enlarged, a desired resist film thickness uniformity (100 Å or less) is obtained in a predetermined critical area (for example, an area of 132 mm×132 mm at the center of the substrate).

Structure 2

A method of producing a mask blank, the method comprising a resist film forming (resist coating) process of dispensing a resist solution containing a resist material and solvent onto a square-like substrate, rotating the substrate to spread the dispensed resist solution over the substrate, and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution containing one of propylene glycol monomethyl ether acetate, propylene glycol monomethyl ether, and methyl isoamyl ketone as the solvent or as a main component of the solvent, the rotation speed of the substrate in the primary stage being 850-1900 rpm, the rotation time of the substrate in the primary stage being 1-5 seconds, the rotation speed of the substrate in the secondary stage being 100-450 rmp.

As mentioned above, the resist film forming (resist coating) process is composed of the primary stage which includes the first step (uniformly coating step), and the secondary stage which includes the second step (drying step).

Herein, the primary (first) stage and the secondary (second) stage may correspond to the first step (uniformly coating step) and the second step (drying step) mentioned above, respectively. In the present specification, description will be made about a case where the primary stage is composed of the first step (uniformly coating step) only and the secondary stage is composed of the second step (drying step) only, by way of example.

In the structure 2, the resist solution, which contains one of propylene glycol monomethyl ether acetate (PGMEA), propylene glycol monomethyl ether (PGME), and methyl isoamyl ketone (MAK) as the solvent or as a main component of the solvent, and is easily dryable relatively. Although the resist solution is easily dryable, by selecting the rotation speed of the substrate in the first step (uniformly coating step) (hereinafter referred to as a main rotation speed), the rotation time of the substrate in the first step (uniformly coating step) (hereinafter referred to as a main rotation time), and the rotation speed of the substrate in the second step (drying step) (hereinafter referred to as a drying rotation speed) within the above-mentioned ranges, a desired resist film thickness uniformity can be maintained within the critical area (for example, an area of 132 mm×132 mm at the center of the substrate) even if the critical area is enlarged.

Structure 3

A method of producing a mask blank, the method comprising a resist film forming (resist coating) process of dispensing a resist solution containing a resist material and a solvent onto a square-like substrate, rotating the substrate to spread the dispensed resist solution over the substrate and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution, which contains ethyl lactate as the solvent or as a main component of the solvent, the rotation speed of the substrate in the primary stage being 850-2000 rpm, the rotation time of the substrate in the primary stage being 1-10 seconds, the rotation speed of the substrate in the secondary stage being 100-450 rpm.

In the structure 3, the resist solution, which contains ethyl lactate as the solvent or as a main component of the solvent, is hardly dryable relatively. Although the resist solution is hardly dryable, by selecting the main rotation speed and the main rotation time in the first step (uniformly coating step) and the drying rotation speed in the second step (drying step) within the above-mentioned ranges, a desired resist film thickness uniformity can be maintained within the critical area (for example, an area of 132 mm×132 mm at the center of the substrate) even if the critical area is enlarged.

Structure 4

A method of producing a mask blank, the method comprising a resist film forming (resist coating) process of dispensing a resist solution containing a resist material and a solvent onto a square-like substrate, rotating the substrate to spread the dispensed resist solution over the substrate and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution containing one of diethylene glycol dimethyl ether, anisole, methyl cellosolve acetate, cyclohexanone, and propylene glycol monomethyl ether acetate as the solvent or as a main component of the solvent, the rotation speed of the substrate in the primary stage being 850-2000 rpm, the rotation time of the substrate in the primary stage being 2-15 seconds, the rotation speed of the substrate in the secondary stage being 50-450 rpm.

In the structure 4, the resist solution, which contains one of diethylene glycol dimethyl ether (DYGLYME), anisole (ANISOLE), methyl cellosolve acetate (MCA), cyclohexanone, and propylene glycol monomethyl ether acetate (PGMEA) as the solvent or as a main component of the solvent, is more hardly dryable relatively. Although the resist solution is more hardly dryable, by selecting the main rotation speed and the main rotation time in the first step (uniformly coating step) and the drying rotation speed in the second step (drying step) within the above-mentioned ranges, a desired resist film thickness uniformity can be maintained within the critical area (for example, an area of 132 mm×132 mm at the center of the substrate) even if the critical area is enlarged.

Structure 5

The method of producing a mask blank according to any one of structures 1 through 3, wherein the resist is a chemically amplified resist.

In structure 5, although the resist is the chemically amplified resist, such as a chemically amplified resist comprising a poly(hydroxystyrene) resin and a photo acid generator, which is generally low in viscosity and easily dryable relatively, a desired resist film thickness uniformity can be maintained within the critical area (for example, an area of 132 mm×132 mm at the center of the substrate) even if the critical area is enlarged.

Structure 6

The method of producing a mask blank according to any one of structures 2 through 4, wherein the rotation of the substrate at the rotation speed in the primary stage is followed by the rotation of the substrate at the rotation speed in the secondary stage.

Structure 7

The method of producing a mask blank according to any one of structures 1 through 6, wherein an unnecessary part of the resist film formed on the substrate is removed, the unnecessary part being located at the peripheral end portion of the substrate and not being involved in pattern formation.

With the structure 7, it is possible to prevent the part of the resist film, which is formed at the peripheral end portion of the substrate and not involved in pattern formation, from being stripped off or flaking by frictional contact or the like that causes dust (particle defect).

Structure 8

The method of producing a mask blank according to any one of structures 1 through 7, wherein the substrate is a thin-film-coated substrate having a thin film formed on the substrate to function as a transfer pattern eventually to be transferred to an object.

Structure 9

The method of producing a mask blank according to structure 8, wherein the thin film is made of a material containing chromium and at least one of oxygen and nitrogen.

In the structure 9, the thin film is made of a material containing chromium and oxygen and/or nitrogen so that wettability and adherability upon forming the resist film are excellent. Therefore, the mask blank having the resist film thickness uniformity of 100 Å or less within a substrate is obtained with high reliability.

Structure 10

A method of producing a transfer mask, wherein the thin film of the mask blank obtained by the method described in any one of structures 1 through 4 is patterned to thereby form a mask pattern including a main pattern and an auxiliary pattern on the substrate.

According to the structure 10, it is possible to prevent a defect on the mask pattern (the main pattern and the auxiliary pattern) formed on the substrate.

Structure 11

A mask blank comprising a substrate, a thin film formed on the substrate to become a transfer pattern to be transferred to an object, and a resist film formed on the thin film, wherein a difference between the maximum thickness of the resist film in an auxiliary pattern forming region, which is surrounding a critical area where a main pattern is to be formed, and the average thickness of the resist film in the critical area is not greater than a half of the average thickness.

In the structure 11, the difference between the maximum thickness of the resist film in the auxiliary pattern forming region and the average thickness of the resist film in the critical area (effective pattern forming region) is not greater than a half of the average thickness. The critical area is located at the center of the substrate where an effective (main) pattern to be transferred to an object is formed. The auxiliary pattern forming region surrounds the critical area at the center of the substrate. With this structure, it is possible to prevent a defect on the pattern of the auxiliary pattern such as a bar code, a quality assurance pattern, and an alignment mark.

Structure 12

The mask blank according to structure 11, wherein an unnecessary part of the resist film formed on the substrate is removed, the unnecessary part being located at the peripheral end portion of the substrate and not being involved in pattern formation.

In the structure 12, the unnecessary part of the resist film, which is formed at the peripheral end portion outside the auxiliary pattern forming region to a remarkably large thickness and which is not involved in formation of the auxiliary pattern, is removed. Therefore, it is possible to suppress and prevent occurrence of dust (particle defects) from the resist film as a result of frictional contact upon storing the mask blank into a storage case (storage boxes) or frictional contact with a contacting portion upon handling or holding the mask blank.

Structure 13

The mask blank according to structure 12, wherein the remaining part of the resist film after the removal of the unnecessary part of the resist film which is located at the peripheral end portion of the substrate has an end (edge) profile having a generally right angle or a rolled-edge shape.

In the structure 13, the remaining part of the resist film after removal of the unnecessary part of the resist film which is located at the peripheral end portion of the substrate has an end (edge) profile (a shoulder portion on a side wall) having a generally right angle or a rolled-edge shape (roll-off shape) without bump (thicker region) at the edge. With this structure, it is possible to suppress and prevent occurrence of dust (particle defects) as a result of stripping off or flaking of the unnecessary part of the resist film formed at the peripheral end portion of the substrate. Further, it is possible to prevent occurrence of a residue upon stripping off of the resist film after patterning in a mask production process (mask blank using process).

Structure 14

The mask blank according to structure 12 or 13, wherein a removed width of the unnecessary part of the resist film from a substrate end to a removal end has a standard deviation of 0.2 mm or less over an entire length of a side of a removed region where the unnecessary part of the resist film located at the peripheral end portion of the substrate is removed.

In the structure 14, the removed width of the unnecessary part of the resist film from the substrate end to the removal end has a standard deviation of 0.2 mm or less over the entire length of the side of the removed region where the unnecessary part of the resist film located at the peripheral end portion of the substrate is removed. With this structure, it is possible to suppress occurrence of residue left unremoved and to suppress and prevent occurrence of dust (particle defects), in a subsequent step, from an end portion of the remaining part of the resist film after the removal of the unnecessary part of the resist film at the peripheral end portion of the substrate.

Structure 15

The mask blank according to any one of structures 11 through 14, wherein a resist forming the resist film is a chemically amplified resist.

In the structure 15, the resist is a chemically amplified resist, such as a chemically amplified resist comprising a poly(hydoxystyrene) resin and a photo acid generator. In this event, the resist film is brittle so that the effect of structures 11 to 14 is remarkable.

According to this invention, the airflow is generated along the upper surface of the substrate from the center of the substrate towards the outer peripheral portion of the substrate while the substrate is rotated in the resist film forming process of forming the resist film on the substrate. Therefore, a puddle of the resist solution formed on each of the four corners of the substrate and the outer peripheral portion of the substrate can effectively be splashed outward from the substrate and is suppressed from moving back towards the center of the substrate. It is therefore possible to achieve a desired resist film thickness uniformity within a predetermined critical area (for example, an area of 132 mm×132 mm at the center of the substrate) even if the critical area is enlarged.

Structure 16

A method of producing a transfer mask, wherein the thin film of the mask blank described in structure 11 is patterned to form a mask pattern including a main pattern and an auxiliary pattern on the substrate.

According to structure 16, it is possible to prevent a defect on the mask pattern (the main pattern and the auxiliary pattern) formed on the substrate.

Structure 17

The method of producing a mask blank according to structure 2, wherein the primary stage includes a uniformly coating step of mainly forming the resist film having a uniform thickness by spreading the dispensed resist solution onto the substrate, the secondary stage includes a drying step of mainly drying the resist film, the rotation speed of the substrate in the uniformly coating step being 850-1900 rpm, the rotation time of the substrate being 1-5 seconds, the rotation speed of the substrate in the drying step being 100-450 rpm.

Structure 18

The method of producing a mask blank according to structure 3, wherein the primary stage includes a uniformly coating step of mainly forming the resist film having a uniform thickness by spreading the dispensed resist solution onto the substrate, the secondary stage includes a drying step of mainly drying the resist film, the rotation speed of the substrate in the uniformly coating step being 850-2000 rpm, the rotation time of the substrate being 1-10 seconds, the rotation speed of the substrate in the drying step being 100-450 rpm.

Structure 19

The method of producing a mask blank according to structure 4, wherein the primary stage includes a uniformly coating step of mainly forming the resist film having a uniform thickness by spreading the dispensed resist solution onto the substrate, the secondary stage includes a drying step of mainly drying the resist film, the rotation speed of the substrate in the uniformly coating step being 850-2000 rpm, the rotation time of the substrate being 2-15 seconds, the rotation speed of the substrate in the drying step being 100-450 rpm.

DESCRIPTION OF THE PREFERRED EMBODIMENTS

Figure 1:
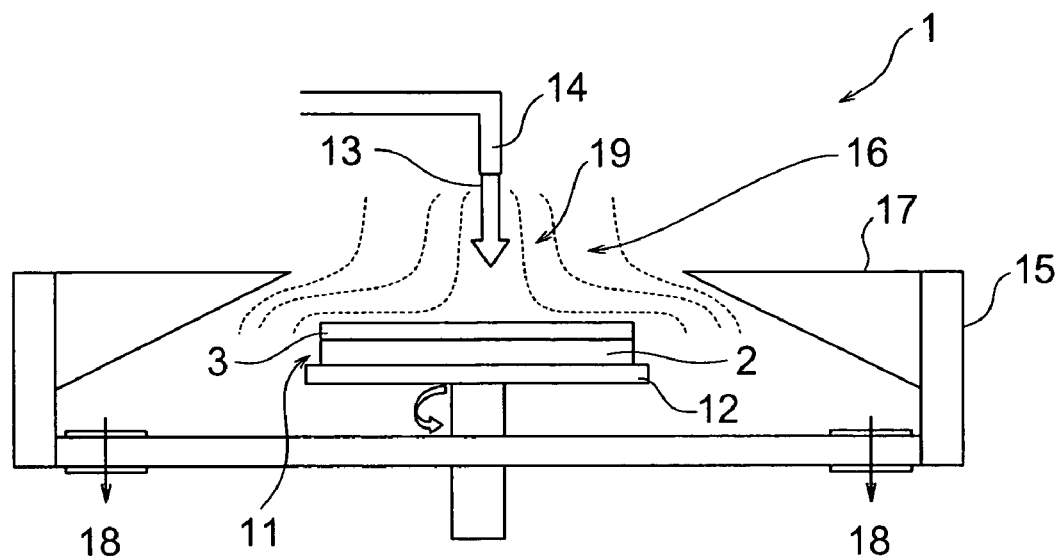
FIG. 1 is a view showing a spin coating apparatus used in a resist coating process.

Now, description will be made of this invention with reference to the drawing.

Figure 2:
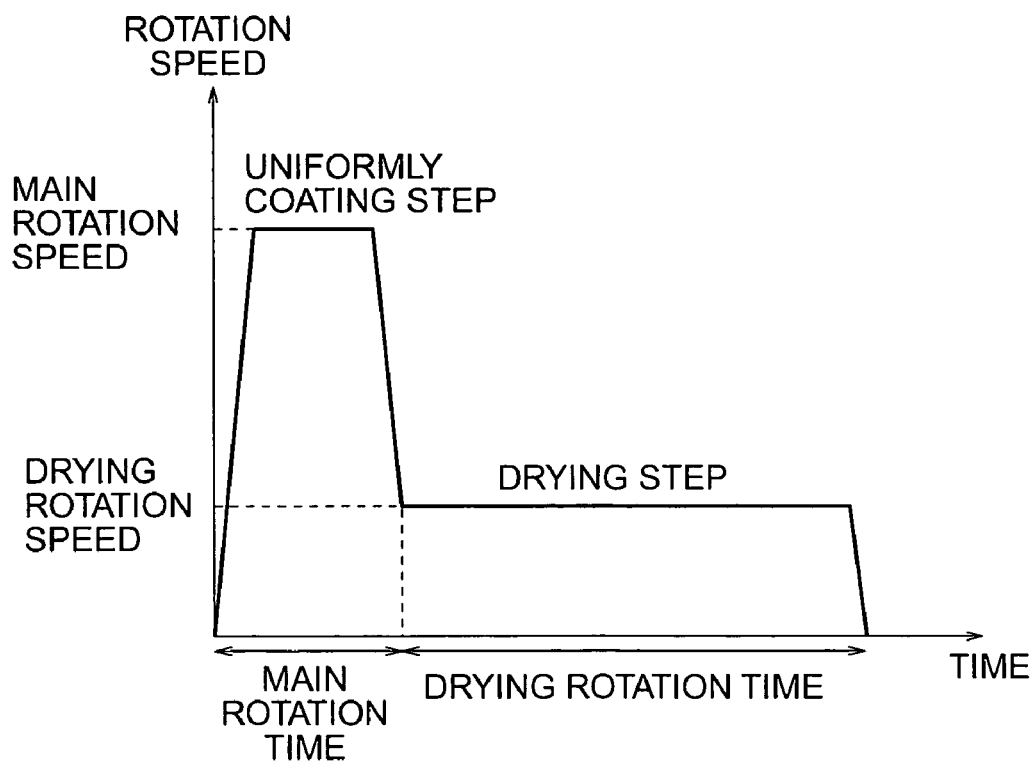
FIG. 2 is a view showing a relationship between a rotation time and a rotation speed in a resist coating process.

Referring to FIGS. 1 and 2, description will be made of a resist coating process in a method of producing a mask blank according to an embodiment of this invention.

<Spin Coating Apparatus>

As illustrated in FIG. 1, a spin-coating apparatus 1 comprises a spin chuck 12 for supporting and rotatably holding a thin-film-coated substrate 11 including a square-like substrate 2 and a thin film such as a light-shielding film (an opaque film) 3 formed on the substrate 2, a nozzle 14 for dispensing a resist solution 13 onto the thin-film-coated substrate 11, a cup 15 for preventing the resist solution 13 dispensed onto the substrate 11 from splashing towards a surrounding area of the spin coating apparatus 1 after splashing to the outside of the substrate 11 due to rotation of the thin-film-coated substrate 11, an inner ring 17 formed at an upper portion of the cup 15 to guide the resist solution 13 splashed to the outside of the substrate 11 to an outer area of a lower portion of the cup 15, and an exhausting member 18 for exhausting air so as to generate an airflow towards the thin-film-coated substrate 11.

The spin chuck 12 is connected to a motor (not shown) for rotating the thin-film-coated substrate 11. The motor serves to rotate the spin chuck 12 under a rotating condition which will later be described.

At the lower portion of the cup 15, located are the exhausting member 18 provided with an exhaust controller for controlling an exhaust volume and a draining member (not shown) for collecting and draining the resist solution 13 splashed to the outside of the thin-film coated substrate 11 during rotation.

The exhaust volume is selected taking the following into consideration. In each of a first step (uniformly coating step) and a second step (drying step), an airflow 19 is generated along an upper surface of the substrate, and from the center to the outer peripheral portion of the substrate during rotation of the substrate, so as to effectively splash a puddle of the resist solution formed at the outer peripheral portion of the substrate (i.e., an end portion of a principal surface of the substrate) to the outside of the substrate and to effectively suppress the puddle of the resist solution formed at each of the four corners and the outer peripheral portion of the substrate from running back towards the center of the substrate. Therefore, a thick region of a resist film formed at the four corners and the peripheral end portion of the substrate is reduced, or an increase in thickness of the resist film in the thick region is reduced (thickening is suppressed). The exhaust volume is determined so as to generate the airflow sufficient to obtain the above-mentioned effect. Specifically, the exhaust volume is controlled so that the airflow colliding with the upper surface of the substrate has a velocity not lower than 0.5 m/sec and not higher than 5 m/sec.

Further, by controlling the height (distance) from the upper surface of the substrate to the inner ring (opening) formed at the upper portion of the cup and an opening diameter of the inner ring, the velocity of the airflow colliding with the upper surface of the substrate and flowing towards the outer peripheral portion of the thin-film-coated substrate is controlled. Thus, the velocity of the airflow is controllably kept at a level required to effectively splash the puddle of the resist solution formed at the outer peripheral portion of the substrate (the end portion of the principal surface of the substrate) to the outside of the substrate and to effectively suppress (prevent) the puddle of the resist solution formed at each of the four corners of the thin-film-coated substrate and the outer peripheral portion of the substrate from running back towards the center of the substrate.

<Resist Coating Method Using Spin Coating Apparatus>

Next referring to FIG. 2, description will be made of a resist coating method using the spin coating apparatus 1 mentioned above.

At first, the thin-film-coated substrate 11 is conveyed by a substrate conveying member (not shown) and placed on the spin chuck 12 of the spin coating apparatus 1.

Then, the resist solution 13 is dispensed from the nozzle 14 onto the thin-film-coated substrate 11 and applied by spin-coating under a rotating condition which will later be described to uniformly form a resist film 4 on the thin-film coated substrate 11.

The substrate, to be coated by the resist coating method according to this invention, has a square-like shape. Therefore, unless the substrate is subjected to the following two steps, a uniform resist film can not be formed in a square or a rectangular pattern region (the critical area) extending to a region outside an inscribed circle of the square-like substrate (mask-blanks).

A first step (uniformly coating step) is a step of mainly forming the resist film having a uniform thickness by rotating the substrate at a predetermined main rotation speed for a predetermined main rotation time after dispensing the resist solution onto the substrate (thin-film-coated substrate). A second step following the first step (uniformly coating step) is a step of mainly drying the resist film having a uniform thickness by rotating the substrate at a predetermined dry rotation speed lower than the main rotation speed.

This invention is characterized in the following respect. In each of the first step (uniformly coating step) and the second step (drying step), the airflow is generated along the upper surface of the substrate, and from the center to the outer peripheral portion of the substrate during rotation of the substrate. By the rotation of the substrate, a puddle of the resist solution formed at the outer peripheral portion of the substrate (the end portion of a principal surface of the substrate) is effectively splashed to the outside of the substrate. Further, the puddle of the resist solution formed at each of the four corners and the outer peripheral portion of the substrate is effectively suppressed from running back towards the center of the substrate. Therefore, the thick region of the resist film formed at the four corners and the peripheral end portion of the substrate is reduced, and/or an increase in thickness of the resist film in the thick region is reduced (thickening is suppressed).

A resist used in the embodiment is not specifically limited. For example, use may be made of a resist such that the resist solution to be applied has a viscosity exceeding 10 mPa·s, for example, a main-chain-fragmentation resist or a crosslinking resist (i.e. high-molecular-weight resist) comprising a high-molecular-weight resin having an average molecular weight of 100,000 or more. Use may also be made of a resist such that the resist solution to be applied has a viscosity lower than 10 mPa·s, for example, a dissolution inhibited resist (novolak-based resist) comprising a novolak resin having an average molecular weight less than 100,000 and a dissolution Inhibitor, or a chemically amplified resist comprising a poly(hydroxystyrene) resin and a photo acid generator. A resist species easily dryable (rapidly dryable), such as the chemically amplified resist, is particularly effective.

According to a base polymer, the chemically amplified resist is classified into a PHS (poly(hydroxystyrene))-based resist, a novolak-based resist, and so on. As the PHS-based chemically amplified resist, various resists such as FEP171 and FEN 270 manufactured by FUJIFILM Arch Co., Ltd., NEB22 manufactured by Sumitomo Chemical Co., Ltd., and OEBR-CAP209 manufactured by Tokyo Ohka Kogyo Co., Ltd. are commercially available.

As a solvent for the chemically amplified resist, use is generally made of a solvent consisting of or containing, as a main component, one of propylene glycol monomethyl ether acetate (PGMEA), propylene glycol monomethyl ether (PGME), ethyl lactate (EL), and methyl isoamyl ketone (MAK).

The above-mentioned chemically amplified resist generally has an average molecular weight less than 100,000. When the resist is dissolved in the above-mentioned solvent to obtain the resist solution, the resist solution has a viscosity as low as 1-10 mPa·s, and is easily dryable relatively. Therefore, although the resist solution is uniformly applied in the uniformly coating step, a puddle of the resist solution formed at the outer peripheral portion of the substrate tends to be drawn back towards the center of the substrate in the uniformly coating step or in the drying step following the uniformly coating step, and also tends to be dried while being drawn back. As a result, the thick region of the resist film is enlarged and the thickness distribution of the resist film within a critical area tends to be deteriorated.

As a solvent for the novolak-based resist, use is generally made of a solvent consisting of or containing as a main component one of propylene glycol monomethyl ether acetate (PGMEA), propylene glycol monomethyl ether (PGME), and ethyl lactate (EL), methyl isoamyl ketone (MAK). The above-mentioned novolak-based resist generally has an average molecular weight less than 100,000. When the resist is dissolved in the above-mentioned solvent to obtain the resist solution, the resist solution has a viscosity as low as 1-10 mPa·s, and is easily dryable relatively. Therefore, the novolak-based resist has a tendency similar to that mentioned in connection with the chemically amplified resist.

As a solvent used for the high-molecular-weight resist, use is generally made of a solvent consisting of or containing as a main component one of diethylene glycol dimethyl ether (DYGLYME), anisole (ANISOLE), methyl cellosolve acetate (MCA), cyclohexanone, and propylene glycol monomethyl ether acetate (PGMEA). The above-mentioned high-molecular-weight resist generally has an average molecular weight larger than 100,000. When the resist is dissolved in the above-mentioned solvent to obtain the resist solution, the resist solution has a viscosity over 10 mPa·s, and is less dryable relatively.

From consideration of the relationship described previously, between the resist film thickness distribution or uniformity within the critical area and the rotation speed and the rotation time, the rotating condition is selected within the following ranges depending upon the solvent used for the resist and the resist species.

(a) the resist species such that the resist solution to be applied has a viscosity exceeding 10 mPa·s (preferably exceeding 10 mPa·s and not greater than 50 mPa·s), for example, the high-molecular-weight resist dissolved in a solvent consisting of or containing as a main component one of diethylene glycol dimethyl ether (DYGLYME), anisole (ANISOLE), methyl cellosolve acetate (MCA), cylohexanone, and propylene glycol monomethyl ether acetate (PGMEA):

main rotation speed: 850-2000 rpm
main rotation time: 2-15 seconds
drying rotation speed: 50-450 rpm (b) the resist species such that the resist solution to be applied has a viscosity not greater than 10 mPa·s, for example, the chemically amplified resist or the novolak-based resist dissolved in a solvent consisting of or containing, as a main component, one of propylene glycol monomethyl ether acetate (PGMEA), propylene glycol monomethyl ether (PGME), and methyl isoamyl ketone (MAK):

main rotation speed: 850-1900 rpm
main rotation time: 1-5 seconds
drying rotation speed: 100-450 rpm (c) the resist species such that the resist solution to be applied has a viscosity not greater than 10 mPa·s, for example, the chemically amplified resist or the novolak-based resist dissolved in a solvent consisting of or containing, as a main component, ethyl lactate (EL):

main rotation speed: 850-2000 rpm
main rotation time: 1-10 seconds
drying rotation speed: 100-450 rpm The drying rotation time is determined as a time required until the resist film is completely dried (until the thickness of the resist film is no longer decreased even if the drying rotation is further continued).

The viscosity in this invention is a viscosity measured at room temperature by the use of a capillary viscometer (Cannon-Fenske viscometer) defined in JIS (Japanese Industrial Standard) Z8803 (1991) "Liquid Viscosity Measurement".

In the above-mentioned condition (a), assuming that the resist is a high-molecular-weight positive resist (main-chain-fragmentation resist comprising a high-molecular-weight resist) ZEP7000 (manufactured by Zeon Corporation), by selecting the main rotation speed within the range of 850-2000 rpm, the main rotation time within the range of 5-15 seconds, and the drying rotation speed within the range of 50-450 rpm, the resist film thickness uniformity within the substrate is assured to be 100 Å or less in a predetermined critical area (132 mm×132 mm at the center of the substrate). Preferably, by selecting the main rotation speed within the range of 1000-1700 rpm, the main rotation time within the range of 7-13 seconds, the drying rotation speed within the range of 150-300 rpm, the resist film thickness uniformity within the substrate is improved to 50 Å or less.

In the above-mentioned condition (b), assuming that the resist is the chemically amplified positive resist (chemically amplified resist containing a poly(hydroxystyrene) resin and a photo acid generator) FEP171 (manufactured by FUJIFILM Arch Co., Ltd.), by selecting the main rotation speed within the range of 1200-1900 rpm, the main rotation time within the range of 1-5 seconds, and the drying rotation speed within the range of 100450 rpm, the resist film thickness uniformity within the substrate is assured to be 100 Å or less in a predetermined critical area (132 mm×132 mm at the center of the substrate). Preferably, by selecting the main rotation speed within the range of 1350-1750 rpm, the main rotation time within the range of 1.5-2.5 seconds, and the drying rotation speed within the range of 150-300 rpm, the resist film thickness uniformity within the substrate is improved to 50 Å or less.

Next, description will be made of a method of producing a mask blank utilizing the resist coating method mentioned above.

The method of producing a mask blank according to this invention comprises a resist coating process utilizing the resist coating method mentioned above. Therefore, the following six embodiments are given as representative embodiments.

1st Embodiment

A method of producing a mask blank, the method comprising a resist film forming (resist coating) process of dispensing a resist solution containing at least one resist material and a solvent onto a square-like substrate, rotating the substrate to spread the dispensed resist solution over the substrate, and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, thereby suppressing a puddle of the resist solution formed at an outer peripheral portion of the substrate from moving towards the center following the rotation of the substrate.

2nd Embodiment

A method of producing a mask blank, the method comprising a resist film forming (resist coating) process of dispensing a resist solution containing at least one resist material and a solvent onto a square-like substrate, rotating the substrate to spread the dispensed resist solution over the substrate, and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution containing one of propylene glycol monomethyl ether acetate, propylene glycol monomethyl ether, and methyl isoamyl ketone as the solvent or as a main component of the solvent, the rotation speed of the substrate in the primary stage being 850-1900 rpm, the rotation time of the substrate in the primary stage being 1-5 seconds, the rotation speed of the substrate in the secondary stage being 100-450 rpm.

3rd Embodiment

A method of producing a mask blank, the method comprising a resist film forming (resist coating) process of dispensing a resist solution containing at least one resist material and a solvent onto a square-like substrate, rotating the substrate to spread the dispensed resist solution over the substrate, and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution containing ethyl lactate as the solvent or as a main component of the solvent, the rotation speed of the substrate in the primary stage being 850-2000 rpm, the rotation time of the substrate in the primary stage being 1-10 seconds, the rotation speed of the substrate in the secondary stage being 100450 rpm.

4th Embodiment

A method of producing a mask blank, the method comprising a resist film forming (resist coating) process of dispensing a resist solution containing at least one resist material and a solvent onto a square-like substrate, rotating the substrate to spread the dispensed resist solution over the substrate, and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution containing ethyl lactate as the solvent or as a main component of the solvent, the resist solution having a viscosity of 1-10 mPa·s, the rotation speed of the substrate in the primary stage being 850-2000 rpm, the rotation time of the substrate in the primary stage being 1-10 seconds, the rotation speed of the substrate in the secondary stage being 100-450 rpm.

5th Embodiment

A method of producing a mask blank, the method comprising a resist film forming (resist coating) process of dispensing a resist solution containing at least one resist material and a solvent onto a square-like substrate, rotating the substrate to spread the dispensed resist solution over the substrate, and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution containing one of diethylene glycol dimethyl ether, anisole, methyl cellosolve acetate, cyclohexanone, and propylene glycol monomethyl ether acetate as the solvent or as a main component of the solvent, the rotation speed of the substrate in the primary stage being 850-2000 rpm, the rotation time of the substrate in the primary stage being 2-15 seconds, the rotation speed of the substrate in the secondary stage being 50-450 rpm.

6th Embodiment

A method of producing a mask blank, the method comprising a resist film forming (resist coating) process of dispensing a resist solution containing at least one resist material and a solvent onto a square-like substrate, rotating the substrate to spread the dispensed resist solution over the substrate, and drying the resist solution spread on the substrate, thereby forming a resist film on the substrate, wherein, while the substrate is rotated in the resist film forming (resist coating) process, an airflow is produced along an upper surface of the substrate from the center of the substrate towards an outer peripheral portion of the substrate, the rotating condition of the substrate in the resist film forming (resist coating) process being changed in the middle of the resist film forming (resist coating) process so that the rotation speed of the substrate is different between a primary stage and a secondary stage of the resist film forming (resist coating) process, the resist solution having a viscosity higher than 10 mPa·s, the rotation speed of the substrate in the primary stage being 850-2000 rpm, the rotation time of the substrate in the primary stage being 2-15 seconds, the rotation speed of the substrate in the secondary stage being 50-450 rpm.

A primary stage includes the first step (the uniformly coating step) of mainly forming the above-mentioned resist film having a uniform thickness and a secondary stage includes the second step (drying step) of mainly drying the resist film while maintaining the uniform thickness of the resist film.

In the embodiments of this invention, the main rotation speed in the first step (uniformly coating step) or the drying rotation speed in the second step (drying step) may be changed stepwise or continuously as far as the effect of this invention is obtained.

In the method of producing a mask blank according to this invention, the resist coating process of forming a resist film on a substrate according to the resist coating method mentioned above may be followed by a heating/drying process to the resist film formed on the substrate in order to vaporize the solvent contained in the resist film. After the resist coating process, the heating/drying process is carried out to evaporate the solvent contained in the resist film formed on the thin-film-coated substrate 11 to obtain a mask blank 10 having the resist film 4.

The substrate may be a thin-film-coated substrate having a thin film to become a mask pattern to be transferred to an object, a thin-film-patterned substrate having a thin film pattern to become a transfer pattern to be transferred to an object, or a simple substrate. In case of the simple substrate, the substrate itself is a mask blank as a material of a chromeless phase shift mask with a trench pattern formed on the substrate surface. Further, the substrate may have both a trench pattern formed on the substrate surface and a thin film patterned on the surface of the substrate.

The method may include the process of forming a thin film on a substrate by sputtering, vapor deposition, or CVD (Chemical Vapor Deposition), The thin film causes optical change to an exposure light, thus becoming a transfer pattern to be transferred to an object.

The heating/drying process is a process of evaporating the solvent contained in the resist solution dispensed onto the substrate to obtain the resist film. The heating/drying process generally includes a heating process of heating the substrate by a heating plate or the like and a cooling process of quenching the substrate by a cooling plate or the like. The heating temperature and the heating time in the heating process and the cooling temperature and the cooling time in the cooling process are appropriately adjusted depending upon the resist species.

If necessary, the resist coating process may be followed by an unnecessary resist film removing process of removing an unnecessary part of the resist film which is formed at the peripheral end portion of the substrate in an outer of the auxiliary patterns are not to be formed.

As an unnecessary film removing apparatus used in the unnecessary resist film removing process, use is preferably made of a technique disclosed in, for example, Japanese Patent Application Publication (JP-A) No. 2001-259502. In the technique disclosed in the above-mentioned publication, a solvent to which the resist film is soluble is supplied to an unnecessary part of the resist film formed at the peripheral end portion of the substrate to thereby remove the unnecessary part of the resist film. In particular, if the resist film is a positive resist, the unnecessary part of the resist film formed at the peripheral end portion of the substrate is subjected to exposure before or after the heating/drying process so as to provide a difference in dissolving rate by a developer chemistry between an exposed region and an unexposed region. Then, the developer chemistry is selectively supplied to the exposed region to remove the unnecessary part of the resist film. The removal of the unnecessary part of the resist film by the exposure and the development is advantageous in the following respects. After the unnecessary part of the resist film is removed at the peripheral end portion of the substrate, the remaining part of the resist film has an end profile (shoulder portion at a removal end) without a remarkably thick part, and an end portion of the removed part (side wall portion of the removed part) has a shoulder portion (upper end portion) generally vertical. The side wall portion of the removed part has a generally right angle and a rolled-edge shape (roll-off shape). The removed width of the unnecessary part of the resist film, i.e., the width from a substrate end to the removal end, is not substantially varied over an entire edge of the removal end, and the removal end is substantially linear.

Figure 3:
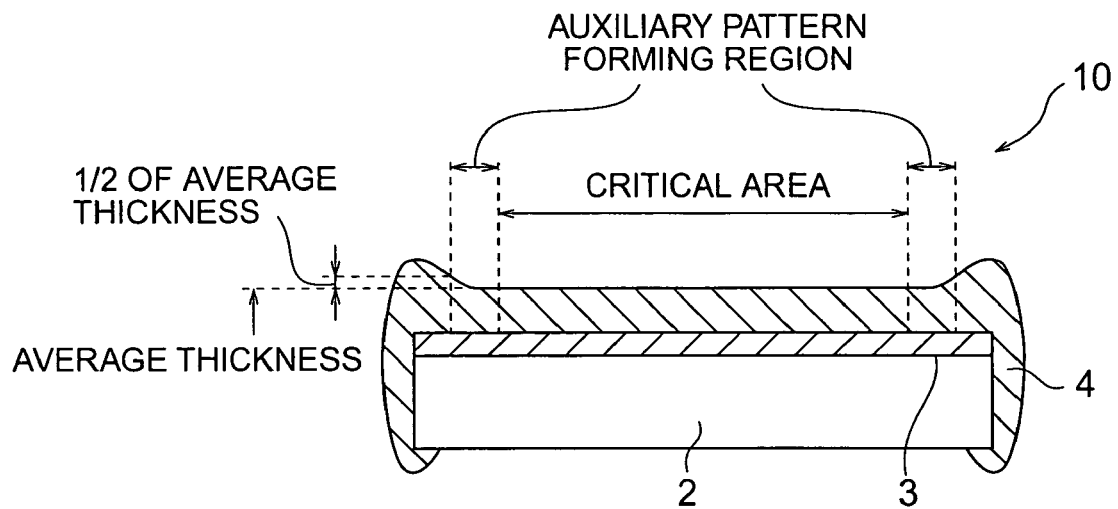
FIG. 3 is a sectional view of a mask blank in which an unnecessary part of a resist film at a peripheral end portion of a substrate is not removed.
Figure 4:
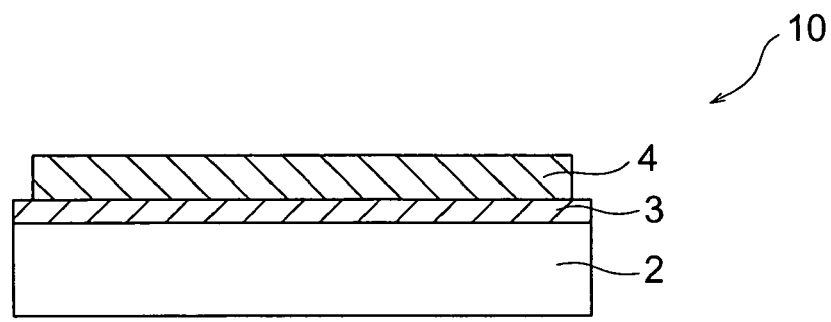
FIG. 4 is a sectional view of a mask blank in which an unnecessary part of the resist film at the peripheral end portion of the substrate is removed.

Referring to FIGS. 3 and 4, a mask blank according to this invention will be described.

As illustrated in FIGS. 3 and 4, the mask blank according to this invention comprises the square-like substrate 2, the thin film (for example, the opaque film 3) which is formed on the substrate 2 and which causes an optical change to an exposure light and which becomes a transfer pattern to be transferred to an object, and the resist film 4 formed on the opaque film 3.

The mask blank has an effective pattern forming region (critical area) located at the center of the principal surface of the substrate and an auxiliary pattern forming region outside the effective (main) pattern forming region. The effective pattern forming region is a region where an effective pattern (main pattern or device pattern) to be transferred, as a circuit pattern, to an object such as a semiconductor substrate is formed when a transfer mask is formed from the mask blank. The auxiliary pattern forming region is a region where auxiliary patterns such as a bar code, a quality assurance pattern, and an alignment mark are to be formed. A combination of the effective (main) pattern and the auxiliary pattern may be referred to as a mask pattern. The mask pattern includes the above-mentioned transfer pattern to be transferred to the object. Some of the mask pattern (some of the auxiliary pattern) is not transferred to the object. The effective pattern forming region and the auxiliary pattern forming region have dimensions depending upon the substrate size of the mask blank and the design of the transfer mask. For example, in case where the substrate size is 6 inch×6 inch, the effective pattern forming region (critical area) is a region of 132 mm×132 mm at the center of the principal surface of the substrate while the auxiliary pattern forming region is a region outside the region of 132 mm×132 mm and inside a region of 150 mm×150 mm.

The mask blank in this invention is characterized in that a difference between the average thickness of the resist film in the critical area and the maximum thickness of the resist film in the auxiliary pattern forming region is not greater than a half of the average thickness.

For example, assuming that the resist film in the critical area has an average thickness of 3000 Å, a reference plane is defined at a height of 3000 Å from the surface of the opaque film. The maximum thickness of the resist film in the auxiliary pattern forming region which surrounds the critical area at the center of the substrate and which is to be provided with the auxiliary patterns, such as the bar code, the quality assurance pattern, and the alignment mark, is not greater than 1500 Å from the above-mentioned reference plane (not greater than 4500 Å from a surface of the opaque film). In this manner, it is possible to prevent pattern errors of the auxiliary patterns formed by exposure and development in a transfer mask production process. Preferably, the difference between the maximum thickness of the resist film in the auxiliary pattern forming region and the average thickness of the resist film in the critical area at the center of the substrate is not greater than ⅕ of the average thickness, more preferably not greater than 1/10 of the average thickness.

As illustrated in FIG. 4, the unnecessary part of the resist film, which is present at the peripheral end portion of the substrate outside the auxiliary pattern forming region to be provided with the bar code, the quality assurance pattern, and the alignment pattern, is preferably removed by a solvent or remover chemistry or the like in view of prevention of occurrence of dust (particle defect). More preferably, the remaining part of the resist film remaining after removal of the unnecessary part of the resist film at the peripheral end portion of the substrate has an end profile having a generally right angle or a rolled-edge shape (a roll-off shape). In order to prevent occurrence of dust (particle defect) in subsequent processes and steps, it is preferred that the removed width from the substrate end to the removal end has a standard deviation of 0.2 mm or less over an entire length of a side of the region at the peripheral end portion of the substrate where the unnecessary part of the resist film is removed.

The mask blank referred to in this invention may be either a transmission mask blank or a reflection mask blank. The mask blank comprises a substrate, a thin film which is formed on the substrate and which causes an optical change to exposure light and becomes a transfer pattern to be transferred to an object, and a resist film formed on the thin film.

The transmission mask blank comprises a light transparent substrate as a substrate. The thin film causing an optical change to exposure light may be an opaque film for shielding the exposure light, a phase shift film (including a halftone film having a light shielding function and a phase shifting function) for changing the phase of the exposure light, or the like.

Therefore, the transmission mask blank may be photomask blanks (photomask blanks) having an opaque film, a phase shift mask blank having a phase shift film (including a halftone film), or the like.

The reflection mask blank comprises a substrate having a small thermal expansion coefficient, a light reflective multilayer film formed on the substrate, and a light absorber film to become a transfer pattern. In this case, an optical change to the exposure light is caused by the multilayer reflective film for reflecting the exposure light and the light absorber film for interrupting the exposure light.

The mask blank in this invention may be provided with a bottom anti-reflective coating (BARC), a top anti-reflective layer (TARL), a top protective film, a conductive film, or the like, other than the above-mentioned films.

The resist film in this invention has an average thickness within a range not greater than 5000 Å, preferably within a range between 100 Å and 5000 Å.

Now, the method of producing a mask blank according to the first embodiment will be described in detail in connection with specific examples.

Example 1

Comparative Examples 1-3

On a synthetic quartz glass substrate having a size of 152.4 mm×152.4 mm, a chromium film and a chromium oxide film were successively deposited by sputtering to obtain a thin-film-coated glass substrate having an opaque film and an antireflection film.

On the thin-film-coated substrate thus obtained, a resist solution was applied by spin coating using the above-mentioned spin coating apparatus under the following coating condition to form a resist film. In Example 1, forced exhaust was continuously carried out to generate the airflow along the upper surface of the substrate from the center of the substrate towards the outer peripheral portion of the substrate while the substrate was rotated in both of the uniformly coating step and the drying step. In Comparative Example 1, forced exhaust was not carried out in the uniformly coating step but was carried out while the substrate was rotated only in the drying step to generate the airflow. In Comparative Example 2, forced exhaust was carried out only in the uniformly coating step to generate the airflow and was not carried out in the drying step. In Comparative Example 3, forced exhaust was not carried out and the airflow was not generated while the substrate was rotated in both of the uniformly coating step and the drying step. The drying step was carried out successively (continuously) after completion of the uniformly coating step.

resist: chemically amplified positive resist FEP171 (manufactured by FUJIFILM Arch Co., Ltd.)
solvent: mixture of PGMEA and PGME
main rotation speed: 1500 rpm
main rotation time: 2 seconds
drying rotation speed: 250 rpm
average resist thickness: 2000 Å
velocity of airflow colliding with upper surface of substrate: 2 m/sec Thereafter, the substrate was conveyed to a heating/drying unit and a cooling unit to be subjected to a predetermined heating/drying process. Thus, a photomask blank with a resist film was obtained.

For the resist film of the photomask blank thus obtained, distribution of the thickness of the resist film was measured. The result is shown in FIG. 5.

The distribution of the thickness of the resist film was measured in the following manner. Throughout a whole of an area of 140 mm×140 mm (critical area) at the center of the substrate, 841 measurement points were uniformly distributed in an array of 29×29. At these measurement points, the thickness was measured by the use of a film thickness measurement system using spectral reflectance (AFT6100M manufactured by Nanometrics Japan). The thickness distribution within the substrate was obtained by acquiring thickness data at the respective measurement points, finding the minimum thickness and the maximum thickness from the thickness data, and subtracting the minimum thickness from the maximum thickness to obtain a difference as the resist film thickness uniformity within the substrate.

Figure 5:
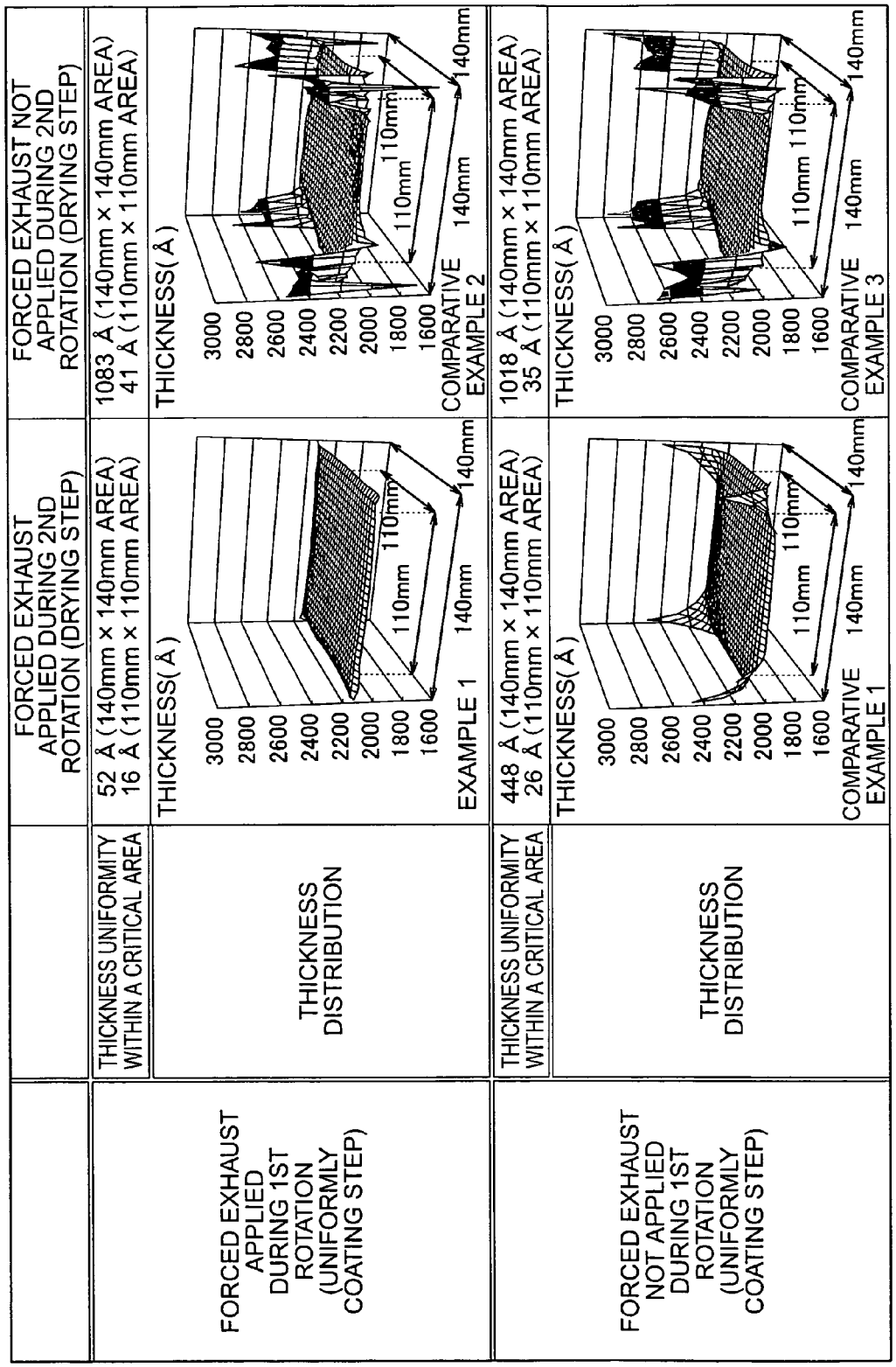
FIG. 5 is a view showing a result of measurement of thickness distribution of a resist film in a mask blank for each of Example 1 and Comparative Examples 1 to 3.

As shown in FIG. 5, in case where the forced exhaust was continuously carried out while the substrate was rotated in each of the uniformly coating step and the drying step to generate the airflow along the upper surface of the substrate from the center of the substrate towards the outer peripheral portion of the substrate, the resist film thickness uniformity within the substrate is 52 Å and an extremely thick area is not formed at each of the four corners of the substrate. On the other hand, in case where the forced exhaust was not carried out and the airflow was not generated in at least one of the uniformly coating step and the drying step, an extremely thick area is formed at each of the four corners of the substrate. The resist film thickness uniformity within the substrate is deteriorated and exceeds 400 Å.

For reference, the resist film thickness uniformity within the substrate in the conventional critical area (110 mm×110 mm) is also shown in FIG. 5 with respect to each of Example 1 and Comparative Examples 1 to 3. In the conventional critical area, an extremely thick area is not formed at each of the four corners of the substrate and the resist film thickness uniformity within the substrate is equal to 16 Å (Example 1), 26 Å (Comparative Example 1), 41 Å (Comparative Example 2), and 35 Å (Comparative Example 3) all of which are 50 Å or less. Thus, excellent result was obtained under any one of the rotating conditions.

From the above, it is understood that, in order to achieve a desired resist film thickness uniformity within the substrate (100 Å or less) in a situation where the effective area for the resist film thickness uniformity within the substrate is enlarged, the forced exhaust must continuously be carried out while the substrate is rotated in both of the uniformly coating step and the drying step to generate the airflow along the upper surface of the substrate from the center of the substrate towards the outer peripheral portion of the substrate.

Hereinafter, description will be made of a method of producing a mask blank in connection with the second through the fourth embodiments.

Example 2

On a synthetic quartz glass substrate having a size of 152.4 mm×152.4 mm, a chromium film and a chromium oxide film were successively deposited by sputtering to obtain a thin-film-coated glass substrate having an opaque film and an antireflection film.

On the thin-film-coated substrate thus obtained, a resist solution was applied by spin coating using the above-mentioned spin coating apparatus under the following coating condition to form a resist film.

resist: chemically amplified positive resist FEP171 (manufactured by FUJIFILM Arch Co., Ltd.)
    solvent: mixture of PGMEA and PGME
    viscosity of resist solution: 3 mPa·s
    main rotation speed: 1500 rpm
    main rotation time: 2 seconds
    drying rotation speed: 250 rpm
    drying rotation time: 20 seconds
    average resist thickness: 4000 Å
    velocity of airflow colliding with upper surface of substrate: 2 m/sec The exhaust was continuously carried out while the substrate is rotated in both of the uniformly coating step and the drying step.

Thereafter, the substrate was conveyed to a heating/drying unit and a cooling unit to be subjected to a predetermined heating/drying process. Thus, a photomask blank with a resist film was obtained.

For the resist film of the photomask blank thus obtained, the resist film thickness uniformity within the substrate was measured.

As a result, the resist film thickness uniformity within the substrate was 35 Å. The resist film thickness uniformity within the substrate was measured in the following manner. Throughout an assurance area (critical area) of 132 mm×132 mm at the center of the substrate, 121 measurement points were uniformly distributed in an array of 11×11. At these points, the thickness was measured by the use of a film thickness measurement system using spectral reflectance (AFT6100M manufactured by Nanometrics Japan), The thickness distribution within the substrate (thickness data at the respective measurement points) was obtained. From the thickness distribution within the substrate, the minimum thickness and the maximum thickness were found. The minimum thickness is subtracted from the maximum thickness to obtain a difference as the resist film thickness uniformity within the substrate.

The thickness of the resist film formed outside the critical area (i.e., formed in the auxiliary pattern forming region) was measured by the film thickness measurement system using spectral reflectance at the pitch of 0.1 mm. As a result, the maximum thickness was 4380 Å. The difference between the maximum thickness in the auxiliary pattern forming region and the average thickness in the critical area was equal to 380 Å which corresponds to about 1/10 of the average thickness.

Examples 3-7

Comparative Examples 4 and 5

The resist film thickness uniformity within the substrate was evaluated in the manner similar to Example 1 except that the drying rotation speed was changed within a range between 50 and 500 rpm while the main rotation speed and the main rotation time were fixed. As a result, the resist film thickness uniformity within the substrate was most excellent at the drying rotation speed of 250 rpm. The drying rotation time was appropriately adjusted. The result of evaluation is shown in Table 1.

In case where the drying rotation speed is 50 rpm and 500 rpm, the resist film thickness uniformity within the substrate was deteriorated and exceeded 100 Å. The reason is as follows. In case where the drying rotation speed is 50 rpm, a long time is required (a long drying rotation time is required) before the resist film is completely dried in the drying step. The puddle of the resist solution at the outer peripheral portion of the substrate is drawn back towards the center of the substrate and simultaneously dried. Therefore, the thick region of the resist film is enlarged and the thickness distribution of the resist film is deteriorated so that the resist film thickness uniformity within the substrate exceeds 100 Å. On the other hand, in case where the drying rotation speed is 500 rpm, the puddle of the resist film is dried in the drying step at each of the four corners of the substrate without returning back towards the center of the substrate. Therefore, the thickness of the resist film at the four corners of the substrate (within the critical area) becomes extremely large, as compared with the resist film at the center of the substrate. As a result, the thickness distribution of the resist film is deteriorated and the resist film thickness uniformity within the substrate exceeds 100 Å.

TABLE 1

|  | Comparative Example 4 | Example | | | | | Comparative Example 5 |
|---|---|---|---|---|---|---|---|
|  |  | 3 | 4 | 5 | 6 | 7 |  |
| Rotation Speed | 50 rpm | 100 rpm | 150 rpm | 200 rpm | 300 rpm | 450 rpm | 500 rpm |
| resist film thickness uniformity within the substrate | 115 Å | 58 Å | 49 Å | 43 Å | 40 Å | 55 Å | 108 Å |

From the above, it is understood that the drying rotation speed must be set within a range between 100 and 450 rpm in order to achieve the resist film thickness uniformity within the substrate of 100 Å or less and that the drying rotation speed must be set within a range between 150 and 300 rpm in order to achieve the resist film thickness uniformity within the substrate of 50 Å or less.

Examples 8-11

Comparative Examples 6-9

Next, a photomask blank with a resist film was produced in the manner similar to Example 2 except that the drying rotation speed was set and fixed to 250 rpm at which the resist film thickness uniformity within the substrate was most excellent and that the main rotation speed and the main rotation time in the uniformly coating step were selected as shown in Table 2. The resist film thickness uniformity within the substrate thus obtained is shown in Table 2.

TABLE 2

|  | Example | | | | Comparative Example | | | |
|---|---|---|---|---|---|---|---|---|
|  | 8 | 9 | 10 | 11 | 6 | 7 | 8 | 9 |
| main rotation speed | 1200 rpm | 1400 rpm | 1750 rpm | 1900 rpm | 1000 rpm | 1000 rpm | 2000 rpm | 2000 rpm |
| main rotation time | 3 sec | 2.5 sec | 1.5 sec | 1 sec | 1 sec | 5.5 sec | 1 sec | 4 sec |
| resist film thickness uniformity within the substrate | 90 Å | 49 Å | 48 Å | 87 Å | 280 Å | 267 Å | 123 Å | 434 Å |

From the above, it is found out that the main rotation speed must fall within a range between 1200 and 1900 rpm, the main rotation time must fall within a range between 1 and 5 seconds, and the drying rotation speed must fall within a range between 100 and 450 rpm in order to maintain the resist film thickness uniformity within the substrate of 100 Å or less in the enlarged assurance area (critical area) (132 mm×132 mm) in case where the chemically amplified positive resist FEP 171 (manufactured by FUJIFILMArch, Co., Ltd.) is used. It is also found out that the main rotation speed must fall within a range between 1400 and 1750 rpm, the main rotation time must fall within a range between 1.5 and 2.5 seconds, and the drying rotation speed must fall within a range between 150 and 300 rpm in order to maintain the resist film thickness uniformity within the substrate of 50 Å or less.

Example 12

Next, a photomask blank with a resist film was produced by the use of a chemically amplified positive resist OEBR-CAP209 (manufactured by Toko Ohka Kogyo Co., Ltd.) under the following conditions.
    solvent: EL
    viscosity of resist solution: 3.8 mPa·s
    main rotation speed: 1250 rpm
    main rotation time: 10 seconds
    drying rotation speed: 300 rpm
    drying rotation time: 60 seconds
    average resist thickness: 3500 Å
    velocity of airflow colliding with upper surface of substrate: 2 m/sec
    resist film thickness uniformity within a substrate: 96 Å

Exhaust was continuously carried out while the substrate was rotated in both of the uniformly coating step and the drying step.

Example 13

Next, a photomask blank with a resist film was produced by the use of a chemically amplified positive resist NEB22 (manufactured by Sumitomo Chemical Co., Ltd.) under the following conditions.
    solvent: PGMEA
    viscosity of resist solution: 1.8 mPa·s
    main rotation speed: 850 rpm
    main rotation time: 4 seconds
    drying rotation speed: 300 rpm
    drying rotation time: 60 seconds average resist thickness: 4000 Å
velocity of airflow colliding with upper surface of substrate: 3 m/sec
resist film thickness uniformity within a substrate: 91 Å

Exhaust was continuously carried out while the substrate was rotated in both of the uniformly coating step and the drying step.

Example 14

Next, a photomask blank with a resist film was produced by the use of a novolak-based positive resist THMR-iP3600 (manufactured by Tokyo Ohka Kogyo Co., Ltd.) under the following conditions.
solvent: MAK
viscosity of resist solution: 2.1 mPa·s
main rotation speed: 1200 rpm
main rotation time: 3 seconds
drying rotation speed: 250 rpm
drying rotation time: 30 seconds
average resist thickness: 5500 Å
velocity of airflow colliding with upper surface of substrate: 0.8 m/sec
resist film thickness uniformity within a substrate: 93 Å

Exhaust was continuously carried out while the substrate was rotated in both of the uniformly coating step and the drying step.

From the results in Examples 2 to 14, the following has also been found out. In case where the resist solution contains a solvent consisting of or containing as a main component one of propylene glycol monomethyl ether acetate (PGMEA), propylene glycol monomethyl ether (PGME), methyl isoamyl ketone (MAK), and ethyl lactate (EL) and/or in case where the resist solution has a viscosity of 1-10 mPa·s, the main rotation speed and the main rotation time in the uniformly coating step are selected within a range between 850 and 2000 rpm and a range between 1 and 10 seconds, respectively, and the drying rotation speed in the drying step is selected within a range between 100 and 450 rpm. Under the above-mentioned condition, a desired resist film thickness uniformity within a substrate (100 Å or less) can be maintained even if the assurance area (critical area) for the resist film thickness uniformity within the substrate is enlarged to 132 mm×132 mm.

Example 15

A photomask blank with a resist film was produced in the manner similar to Example 2 except that the resist film after spin coating of the resist solution and before heating/drying was subjected to the unnecessary film removing process to remove the unnecessary part of the resist film formed at the peripheral end portion of the substrate outside the auxiliary pattern forming region.

As an exposure light source, use was made of a mercury lamp (UL500L manufactured by HOYA-SHOTT) having a quartz-fiber light guide (10 mmφ and a condenser lens having a focal distance of 10 mm and attached to an end of the light guide. A stencil mask having a square opening of 3 mm×3 mm was fixed to a focal point. The stencil mask was placed at a distance of 3 mm from the upper surface of the substrate so that about 15 mm of the stencil mask (exposure window) overlaps a part of the substrate from a substrate end towards the center of the substrate. Then, the exposure light source was turned on. Simultaneously, the exposure window was moved by a scanning member along one side of the peripheral end portion of the substrate at a velocity of about 10 mm/sec. After completion of exposure of one side of 152 mm, the substrate was rotated by 90 degrees. Then, a next side was exposed. In the similar manner, all of four sides of the substrate were exposed. Thus, the unnecessary part of the resist film at the peripheral end portion of the substrate was exposed as a selectively exposed part.

Next, by the use of the apparatus described in Japanese Patent Application Publication (JP-A) No. 2001-259502, a developer was selectively supplied to the selectively exposed part mentioned above. Specifically, while the substrate was rotated at 500 rpm, a standard developer 2.38% TMAH (NMD-3 manufactured by Tokyo Ohka Kogyo CO., LTD.) was supplied at a flow rate of 100 cc/min for 30 seconds to develop and remove the unnecessary part of the resist film. Immediately thereafter, ultra pure water was supplied instead of the developer to rinse the substrate at a resist-removed portion where the unnecessary part of the resist film was developed and removed. Then, the substrate was rotated at 2000 rpm to perform spin drying. Thus, removal of the unnecessary part of the resist film at the peripheral end portion of the substrate was completed.

Finally, the substrate after the above-mentioned step was heated for ten minutes by a hot plate (proximity gap: 0.2 mm) kept at 150° C. to heat and dry the resist film. Thus, the mask blank was produced.

By the use of a stylus probe-type step (thickness) measurement system, a section of the resist-removed portion (removal end) at the peripheral end portion of the substrate where the resist film was removed was measured. As a result, no remarkable upraise or upheaval was observed at the removal end and a side wall portion of the removal end was generally vertical. The end profile had a rolled-edge shape.

Further, measurement was made of a removed width (distance from the substrate end to the removal end) of the resist-removed portion at the peripheral end portion of the substrate where the resist film was removed. The removed width was measured for an entire length of each side. For measurement, a resist thickness measurement system (AFT6100M manufactured by Nanometrics Japan) was used. The removed width was measured at an interval of 10 mm for each side of the substrate and a standard deviation was calculated. As a result, the standard deviation was as excellent as 0.1 mm.

By the use of the mask blank thus obtained, a transfer mask was produced. As described in connection with Example 2, the difference between the maximum thickness of the resist film in the auxiliary pattern forming region and the average thickness was about 1/10 of the average thickness. Therefore, the transfer mask did not have pattern errors of the auxiliary patterns, such as the bar code, the quality assurance pattern, the alignment mark, and pattern defects resulting from dust (particle defect) caused by stripping off or separation of the unnecessary part of the resist film at the peripheral end portion of the substrate.

Reference Example

A mask blank was produced in the manner similar to Example 2 except the following. The resist film after spin coating of the resist and before heating/drying was treated by the use of the apparatus described in Japanese Patent Application Publication (JP-A) No. 2001-259502 to remove the resist film formed at the peripheral end portion of the substrate outside the auxiliary pattern forming region by the use of acetone. Thereafter, in the manner similar to Example 13, the substrate was subjected to post-coat baking for 10 minutes by the use of the hotplate (proximity gap: 0.2 mm) kept at 150° C. Thus, the mask blank was produced.

By the use of a stylus probe-type step (thickness) measurement system, measurement was made of a section of a resist removed portion (removal end) at the peripheral end portion of the substrate where the resist film was removed. As a result, a remarkably thick portion having a height of about 1.5 μm was formed at the removal end.

Further, measurement was made of a removed width (distance from the substrate end to the removal end) of the resist-removed portion at the peripheral end portion of the substrate where the resist film was removed. The removed width was measured for an entire length of each side. For measurement, a resist thickness measurement system (AFT6100M manufactured by Nanometrics Japan) was used. The removed width was measured at an interval of 10 mm for each side of the substrate and a standard deviation was calculated. As a result, the standard deviation was deteriorated to 0.24 mm.

By the use of the mask blank thus obtained, a transfer mask was produced. In this case, a pattern error (resolution error) of an alignment mark over the thick region at the removal end was confirmed. Further, a pattern error due to dust (particle defects) assumed to be generated from the removal end was partly confirmed.

Now, description will be made of a method of producing a mask blank according to fifth and sixth embodiments of this invention in connection with specific examples.

Examples 16-23

Comparative Examples 10-13

On a synthetic quartz glass substrate having a size of 152.4 mm×152.4 mm, a chromium film and a chromium oxide film were successively deposited by sputtering to obtain a thin-film-coated glass substrate having an opaque film and an antireflection film comprising the chromium film and the chromium oxide film, respectively.

On the thin-film-coated substrate thus obtained, a resist solution was applied by spin coating using the above-mentioned spin coating apparatus under the following coating condition to form a resist film.

resist: high-molecular-weight positive resist ZEP7000 (manufactured by ZEON CORPORATION)
solvent: DIGLYME
viscosity of resist solution: 17 mPa·s
average resist thickness: 3000 Å
velocity of airflow colliding with upper surface of substrate: 3 m/sec The exhaust was continuously carried out while the substrate was rotated in both of the uniformly coating step and the drying step. As to the drying rotation time, the substrate was rotated until the resist film was completely dried (until the thickness of the resist film was no longer decreased even if the drying rotation was further continued).

The resist film thickness uniformity within the substrate, thus obtained, is shown in Table 3.

TABLE 3

| | Example | | | | | | |
|---|---|---|---|---|---|---|---|
| | 16 | 17 | 18 | 19 | 20 | 21 | 22 |
| main rotation speed | 850 rpm | 850 rpm | 2000 rpm | 1850 rpm | 1700 rpm | 1000 rpm | 1350 rpm |
| main rotation time | 6 sec | 15 sec | 5 sec | 12 sec | 7.5 sec | 12.5 sec | 13 sec |
| drying rotation speed | 250 rpm | 250 rpm | 250 rpm | 250 rpm | 250 rpm | 250 rpm | 50 rpm |
| resist film thickness uniformity within the substrate | 98 Å | 87 Å | 91 Å | 85 Å | 44 Å | 49 Å | 93 Å |

| | Example | Comparative Example | | | |
|---|---|---|---|---|---|
| | 23 | 10 | 11 | 12 | 13 |
| main rotation speed | 1500 rpm | 850 rpm | 800 rpm | 2000 rpm | 2050 rpm |
| main rotation time | 15 sec | 4 sec | 6 sec | 4 sec | 6 sec |
| drying rotation speed | 450 rpm | 250 rpm | 250 rpm | 150 rpm | 200 rpm |
| resist film thickness uniformity within the substrate | 90 Å | 198 Å | 157 Å | 212 Å | 117 Å |

Example 24

Next, by the use of a high-molecular-weight positive resist PBS (poly(butene-1-sulfone)) (manufactured by Chisso Corporation), a photomask blank with a resist film was produced under the following conditions.

solvent: MCA
main rotation speed: 1100 rpm
main rotation time: 15 seconds
drying rotation speed: 300 rpm
drying rotation time: 100 seconds
average resist thickness: 4000 Å
velocity of airflow colliding with upper surface of substrate: 3 m/sec
resist film thickness uniformity within a substrate: 91 Å

The exhaust was continuously carried out while the substrate was rotated in both of the uniformly coating step and the drying step.

Although not shown as examples, the similar results were obtained for other resist solutions using ANISOLE, cyclohexanone, and propylene glycol monomethyl ether acetate as solvents.

From the above-mentioned results, the following has been found out. In case where the resist solution contains a solvent consisting of or containing as a main component one of diethylene glycol dimethyl ether (DYGLYME), anisole (ANISOLE), methyl cellosolve acetate (MCA), cyclohexanone, and propylene glycol monomethyl ether acetate (PGMEA) and/or in case where the resist solution has a viscosity higher than 10 mPa·s and not higher than 50 mPa·s, the main rotation speed must be selected within a range between 850 and 2000 rpm, the main rotation time must be selected within a range between 2 and 15 seconds, and the drying rotation speed must be selected within a range between 50 and 450 rpm in order to maintain the resist film thickness uniformity within the substrate of 100 Å or less in an enlarged critical area (132 mm×132 mm). It is also found out that the main rotation speed must be selected within a range between 1000 and 1700 rpm, the main rotation time must be selected within a range between 5 and 13 seconds, and the drying rotation speed must be selected within a range between 150 and 300 rpm in order to maintain the resist film thickness uniformity within the substrate of 50 Å or less.

While this invention has thus far been described in conjunction with the preferred embodiments and the specific examples thereof, it will be readily possible for those skilled in the art to put this invention into practice in various other manners without departing from the scope set forth in the appended claims.

What is claimed is:

1. A method of producing a mask blank, the method comprising:
    a resist film forming process of dispensing a resist solution containing a resist material and a solvent onto a substrate that is substantially square in shape,
    rotating the substrate to spread the dispensed resist solution over the substrate, and
    drying the resist solution spread on the substrate, thereby forming a resist film on the substrate, wherein:
    during the rotating step, a puddle of the resist solution is formed at an outer peripheral portion of the substrate while the substrate is rotated in the resist film forming process, the resist solution having a viscosity such that the puddle is drawn back towards a center of the substrate during the rotation of the substrate, and
    an airflow is produced along an upper surface of the substrate from the center of the substrate towards the outer peripheral portion of the substrate, and is controlled in velocity and direction so as to suppress the puddle from moving towards the center because of the viscosity of the resist solution during the rotation of the substrate, and
    wherein the resist film forming process includes a primary stage for rotating the substrate at a first rotation speed and a secondary stage for rotating the substrate at a second rotation speed lower than the first rotation speed.

2. A method of producing a mask blank, the method comprising:
    a resist film forming process of dispensing a resist solution containing a resist material and a solvent onto a substrate that is substantially square in shape,
    rotating the substrate to spread the dispensed resist solution over the substrate, and
    drying the resist solution spread on the substrate, thereby forming a resist film on the substrate, wherein:
    during the rotating step, a puddle of the resist solution is formed at an outer peripheral portion of the substrate while the substrate is rotated in the resist film forming process, the resist solution has a viscosity such that the puddle is drawn back towards a center of the substrate during the rotation of the substrate, and
    an airflow is produced along an upper surface of the substrate from the center of the substrate towards the outer peripheral portion of the substrate and is controlled in velocity and direction so as to suppress the puddle from moving towards the center because of the viscosity of the resist solution during the rotation of the substrate;
    a rotating condition of the substrate in the resist film forming process being changed in the middle of the resist film forming process so that a rotation speed of the substrate is different between a primary stage and a secondary stage of the resist film forming process;
    the resist solution containing one of propylene glycol monomethyl ether acetate, propylene glycol monomethyl ether, and methyl isoamyl ketone as the solvent or as a main component of the solvent; and
    the rotation speed of the substrate in the primary stage being 850-1900 rpm, a rotation time of the substrate in the primary stage being 1-5 seconds, the rotation speed of the substrate in the secondary stage being 100-450 rpm.

3. A method of producing a mask blank, the method comprising:
    a resist film forming process of dispensing a resist solution containing a resist material and a solvent onto a substrate that is substantially square in shape,
    rotating the substrate to spread the dispensed resist solution over the substrate, and
    drying the resist solution spread on the substrate, thereby forming a resist film on the substrate, wherein:
    a puddle of the resist solution is formed at an outer peripheral portion of the substrate while the substrate is rotated in the resist film forming process, the resist solution has a viscosity such that the puddle is drawn back towards a center of the substrate during the rotation of the substrate, and
    an airflow is produced along an upper surface of the substrate from the center of the substrate towards the outer peripheral portion of the substrate and is controlled in velocity and direction so as to suppress the puddle from moving towards the center because of the viscosity of the resist solution during the rotation of the substrate;
    a rotating condition of the substrate in the resist film forming process being changed in the middle of the resist film process so that a rotation speed of the substrate is different between a primary stage and a secondary stage of the resist film forming process; and the resist solution containing ethyl lactate as the solvent or as a main component of the solvent, the rotation speed of the substrate in the primary stage being 850-2000 rpm, a rotation time of the substrate in the primary stage being 1-10 seconds, the rotation speed of the substrate in the secondary stage being 100-450 rpm.

4. The method of producing a mask blank according to any one of claims 1 through 3, wherein:

the resist is a chemically amplified resist.

5. The method of producing a mask blank according to any one of claims 2 and 3, wherein:

the rotation of the substrate at the rotation speed in the primary stage is followed by the rotation of the substrate at the rotation speed in the secondary stage.

6. The method of producing a mask blank according to any one of claims 1 through 3, wherein:

an unnecessary part of the resist film formed on the substrate is removed, the unnecessary part being located at the peripheral end portion of the substrate and not being involved in pattern formation.

7. The method of producing a mask blank according to any one of claims 1 through 3, wherein:

the substrate is a thin-film-coated substrate having a thin film formed on the substrate to function as a transfer pattern to be transferred to an object.

8. The method of producing a mask blank according to claim 7, wherein:

the thin film is made of a material containing chromium and at least one of oxygen and nitrogen.

9. A method of producing a transfer mask, wherein the thin film of the mask-blanks obtained by the method claimed in claim 7 is patterned to form, on the substrate, a mask pattern including a main pattern and an auxiliary pattern.

10. The method of producing a mask blank according to claim 2, wherein the primary stage includes a uniformly coating step of mainly forming the resist film having a uniform thickness by spreading the dispensed resist solution onto the substrate, the secondary stage includes a drying step of mainly drying the resist film, the rotation speed of the substrate in the uniformly coating step being 850-1900 rpm, the rotation time of the substrate being 1-5 seconds, the rotation speed of the substrate in the drying step being 100-450 rpm.

11. The method of producing a mask blank according to claim 3, wherein the primary stage includes a uniformly coating step of mainly forming the resist film having a uniform thickness by spreading the dispensed resist solution onto the substrate, the secondary stage includes a drying step of mainly drying the resist film, the rotation speed of the substrate in the uniformly coating step being 850-2000 rpm, the rotation time of the substrate being 1-10 seconds, the rotation speed of the substrate in the drying step being 100-450 rpm.

12. The method of producing a mask blank according to claim 1, wherein:

the resist solution has a viscosity of 1-10 mPa·s,
the first rotation speed of the substrate in the primary stage is 850-2000 rpm,
a rotation time of the substrate in the primary stage is 1-10 seconds, and
the second rotation speed of the substrate in the secondary stage is 100-450 rpm.

13. The method of producing a mask blank according to claim 1, wherein:

the primary stage includes a uniformly coating step of mainly forming the resist film so as to have a uniform thickness, and
the secondary stage includes a drying step of mainly drying the resist film while maintaining the uniform thickness of the resist film.

14. The method of producing a mask blank according claim 1, wherein:

the air flow is generated from an opening located between the upper surface of the substrate and an upper portion of a cup by an exhausting member, the cup preventing the resist solution dispensed onto the substrate from splashing towards a surrounding area.

15. The method of producing a mask blank according to claim 14, wherein:

a velocity of the airflow colliding with the upper surface of the substrate and flowing towards the outer peripheral portion of the substrate is controlled by setting a distance from the upper surface of the substrate to the opening and an opening diameter of the opening.

16. The method of producing a mask blank according to claim 1, wherein:

the airflow colliding with the upper surface of the substrate has a velocity not lower than 0.5 m/sec and not higher than 5 m/sec.

17. The method of producing a mask blank according to claim 1, wherein:

the rotation of the substrate in the secondary stage is performed until the resist film reaches a state where no substantial variation in thickness occurs due to external factors except a thermal factor.

18. The method of producing a mask blank according to claim 1, wherein:

the substrate has a substrate size of 6 inch×6 inch, and
a resist film thickness uniformity is 100 Å or less in a critical area located at a center of the substrate within the resist film.

19. The method of producing a mask blank according to claim 1, wherein:

the substrate has a substrate size of 6 inch×6 inch, and
a difference between (1) a maximum thickness of the resist film inside a region of 140 mm×140 mm, which is surrounding a region of 132 mm×132 mm where a main pattern is to be formed, and (2) an average thickness of the resist film in the region of 132 mm×132 mm is not greater than a half of the average thickness of the resist film in the region of 132 mm×132 mm.

* * * * *